United States Patent
Lin et al.

(10) Patent No.: US 9,202,790 B2
(45) Date of Patent: Dec. 1, 2015

(54) SEMICONDUCTOR DEVICE FOR ESD PROTECTION

(71) Applicant: CSMC TECHNOLOGIES FAB1 CO., LTD., Jiangsu (CN)

(72) Inventors: Zhongyu Lin, Jiangsu (CN); Meng Dai, Jiangsu (CN); Yonghai Hu, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/411,550

(22) PCT Filed: Oct. 22, 2012

(86) PCT No.: PCT/CN2012/083271
§ 371 (c)(1),
(2) Date: Dec. 29, 2014

(87) PCT Pub. No.: WO2014/063276
PCT Pub. Date: May 1, 2014

(65) Prior Publication Data
US 2015/0162286 A1    Jun. 11, 2015

(51) Int. Cl.
| | |
|---|---|
| *H01L 27/00* | (2006.01) |
| *H01L 23/60* | (2006.01) |
| *H01L 27/02* | (2006.01) |
| *H01L 29/74* | (2006.01) |
| *H01L 29/06* | (2006.01) |

(52) U.S. Cl.
CPC ............ *H01L 23/60* (2013.01); *H01L 27/0262* (2013.01); *H01L 29/0692* (2013.01); *H01L 29/7436* (2013.01); *H01L 2924/0002* (2013.01)

(58) Field of Classification Search
CPC . H01L 27/0262; H01L 23/60; H01L 29/7436; H01L 29/0692
See application file for complete search history.

(56) References Cited

U.S. PATENT DOCUMENTS

| | | | |
|---|---|---|---|
| 5,742,084 A | 4/1998 | Yu | |
| 8,680,620 B2 * | 3/2014 | Salcedo | H01L 27/0262 257/355 |
| 8,860,080 B2 * | 10/2014 | Salcedo | H01L 27/0623 257/140 |
| 8,946,822 B2 * | 2/2015 | Salcedo | H01L 27/0259 257/355 |
| 8,947,841 B2 * | 2/2015 | Salcedo | H01L 23/60 361/111 |
| 2002/0079538 A1 | 6/2002 | Su et al. | |
| 2003/0052332 A1 | 3/2003 | Chen | |
| 2003/0102488 A1 | 6/2003 | Huang | |
| 2012/0199874 A1 * | 8/2012 | Salcedo | H01L 27/0262 257/120 |

OTHER PUBLICATIONS

International Search Report dated Aug. 1, 2013.

* cited by examiner

*Primary Examiner* — Nathan Ha
(74) *Attorney, Agent, or Firm* — Novak Druce Connolly Bove + Quigg LLP

(57) ABSTRACT

A semiconductor device for electrostatic discharge protection includes a substrate, a first well and a second well formed in the substrate. The first and second wells are formed side by side, meeting at an interface, and have a first conductivity type and a second conductivity type, respectively. A first heavily doped region and a second heavily-doped region are formed in the first well. A third heavily doped region and a fourth heavily-doped region are formed in the second well. The first, second, third, and fourth heavily-doped regions have the first, second, second, and first conductivity types, respectively. Positions of the first and second heavily-doped regions are staggered along a direction parallel to the interface.

15 Claims, 4 Drawing Sheets

SEMICONDUCTOR DEVICE FOR ESD PROTECTION

CROSS-REFERENCE TO RELATED APPLICATIONS

This application is a National Phase filing under 35 U.S.C. §371 of PCT/CN2012/083271 filed on Oct. 22, 2012 the entire contents of which is hereby incorporated by reference.

FIELD OF THE INVENTION

The present disclosure relates to a semiconductor device for electrostatic discharge (ESD) protection.

BACKGROUND OF THE INVENTION

Electrostatic discharge (ESD) is a natural phenomenon occurring frequently in daily life. ESD can generate a large current in a short period of time. For example, a human body model (HBM) electrostatic discharge usually occurs within several hundreds of nanosecond, with a peak current of several amperes. Electrostatic discharge of some other modes, such as a machine model (MM) and a charged device model (CDM), may occur in a shorter period of time and may have a larger current.

When the large current generated by the ESD passes through an integrated circuit in a short period of time, it may result in a power consumption much higher than what the integrated circuit can bear, causing physical damage to the integrated circuit and, possibly, circuit failure. In fact, ESD has become a major factor that causes failure of integrated circuits during their manufacture and use.

In practice, two approaches have been followed to reduce or prevent damage caused by ESD: the environment and the circuit itself. With regard to the environment, the approach mainly involves reducing the production of static electricity and timely removing the generated static electricity, such as using materials that do not easily generate static electricity, increasing the environment humidity, or grounding operators and/or apparatuses. With regard to the circuit, the approach mainly involves improving the ESD resistivity of the circuit, such as by using an ESD protection device or circuit to protect the internal circuit from ESD damages.

With regard to using an. ESD protection device, a trigger voltage of the ESD protection device should be lower than that of the device being protected. The ESD protection device should also have a capability of discharging current. In addition, the DC breakdown voltage of the ESD protection device should be higher than the power source voltage. The ESD protection device should meet such conditions so as to not impact the operation of the device being protected. To avoid a problem of latching up, a holding voltage of the ESD protection device should be higher than the power source voltage.

SUMMARY OF THE INVENTION

Consistent with embodiments of the present disclosure, there is provided a semiconductor device for electrostatic discharge protection. The semiconductor device comprises a substrate, a first well and a second well formed in the substrate. The first and second wells are formed side by side, meeting at an interface, and have a first conductivity type and a second conductivity type, respectively. A first heavily doped region and a second heavily-doped region are formed in the first well. The first and second heavily-doped regions have the first and the second conductivity types, respectively, and are positioned at a first distance and a second distance from the interface, respectively. A third heavily doped region and a fourth heavily-doped region are formed in the second well. The third and fourth heavily-doped regions have the second and the first conductivity types, respectively, and are positioned at a third distance and a fourth distance from the interface, respectively. The fourth distance is different from the third distance. Positions of the first and second heavily-doped regions are staggered along a direction parallel to the interface.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated, in and constitute a part of this specification, illustrate several embodiments and together with the description, serve to explain the principles of the invention.

DETAILED DESCRIPTION OF THE EMBODIMENTS

Embodiments consistent with the disclosure include a silicon-controlled rectifier (SCR) structure for electrostatic discharge (ESD) protection.

Hereinafter, embodiments consistent with the disclosure will be described with reference to drawings. Wherever possible, the same reference numbers will be used throughout the drawings to refer to the same or like parts.

An silicon-controlled rectifier (SCR) is a device that can be used for ESD protection. As used herein, an SCR comprises an N-well and a P-well formed adjacent to each other, with a heavily doped P-type ($P^+$) region and a heavily doped N-type ($N^+$) region formed in the N-well and the P-well, respectively. Therefore, the basic structure of the SCR comprises a PNPN structure, where the $P^+$ region, the N-well, and the P-well form a PNP transistor, while the N-well, the P-well, and the $N^+$ region form an NPN transistor.

In operation, the SCR is usually connected in parallel with the circuit to be protected. When ESD occurs, excessive charges are generated by ESD, which increase the voltage applied to the SCR. When the voltage applied to the SCR becomes higher than a trigger voltage of the SCR, avalanche breakdown may occur at the N-P junction formed by the N-well and the P-well. The generated current turns on one of the PNP transistor or the NPN transistor. Both of the PNP and the NPN transistors then become saturated. As a result, the SCR enters into a low-resistance state, and starts to conduct the major portion of the charges generated by the ESD. Consequently, the circuit being protected bears only a minor portion of the ESD charges, and thus avoids being damaged. After the SCR enters into the low-resistance state and the ESD charges are being conducted by the SCR, the voltage applied to the SCR decreases. When the voltage applied to the SCR becomes lower than a holding voltage of the SCR, the SCR turns off.

Figure 1A:
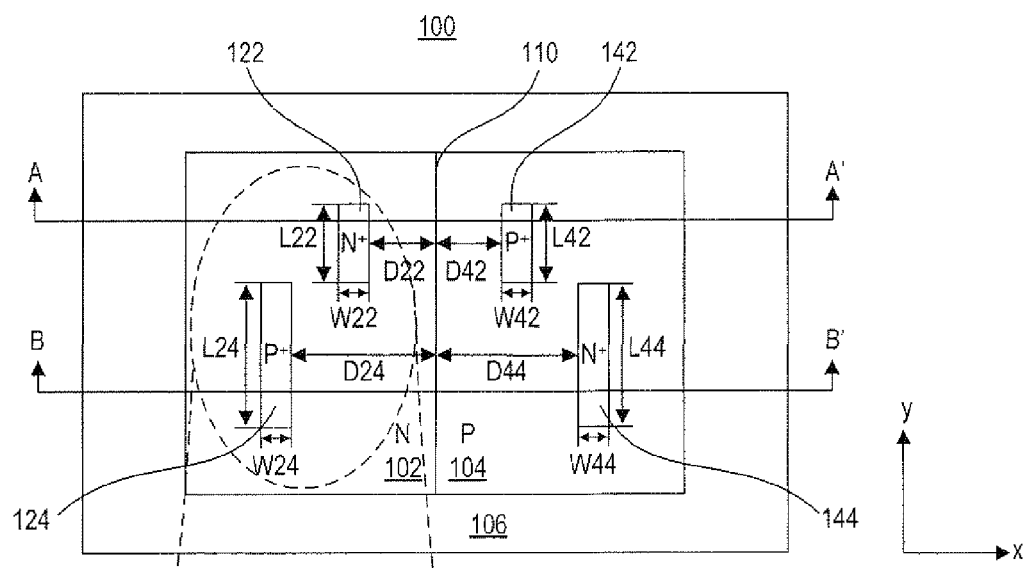
FIG. 1A is a plan view schematically showing a layout of an SCR structure according to an exemplary embodiment.
Figure 1B:
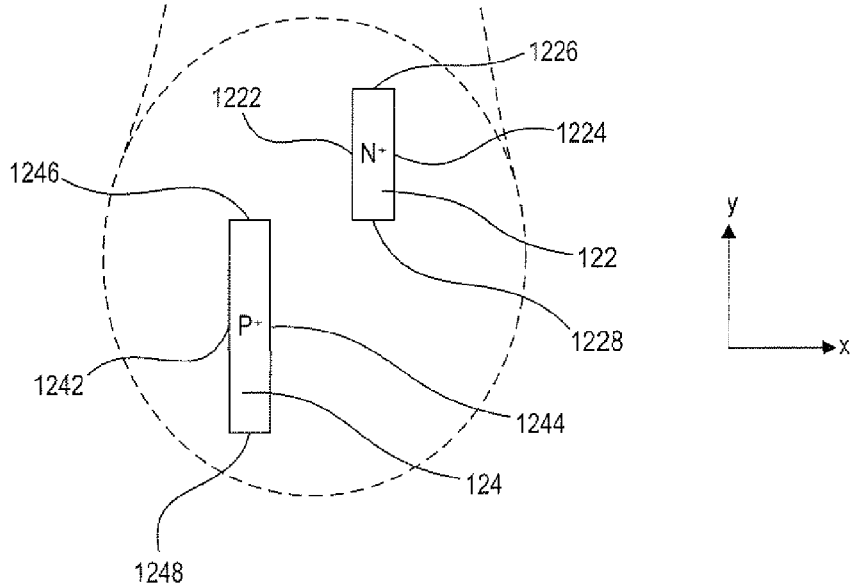
FIG. 1B is an enlarged plan view schematically showing a portion of the SCR structure of FIG. 1A.
Figure 2A:
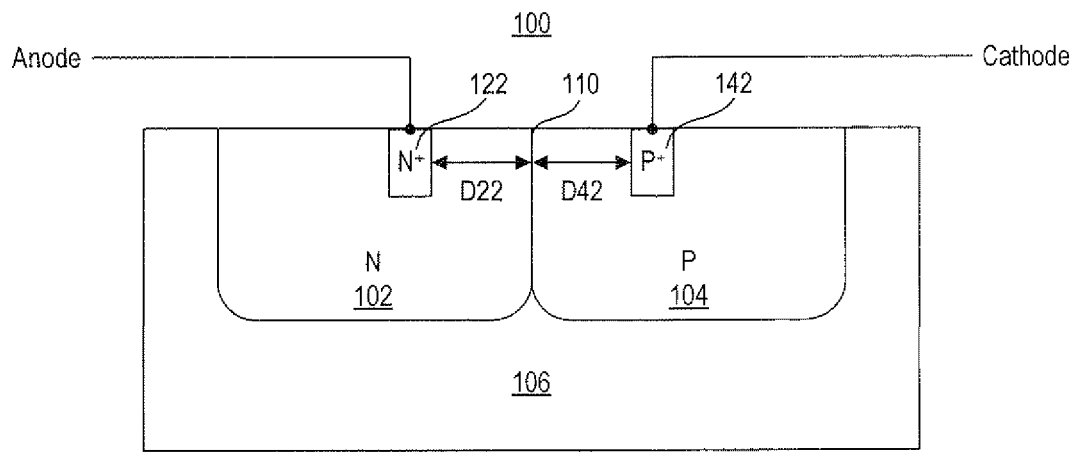
FIGS. 2A and 2B are schematic cross-sectional views of the SCR structure of FIG. 1A along section line AA' and line BB', respectively.
Figure 2B:
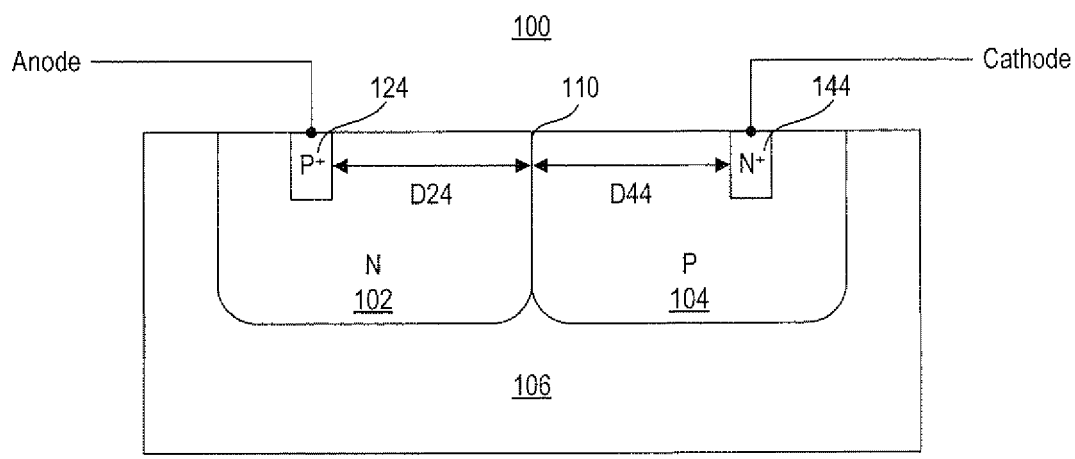

FIG. 1A is a plan view schematically showing a layout of an SCR structure 100 consistent with embodiments of the present disclosure. FIG. 1B is an enlarged plan view schematically showing a portion of the SCR structure 100. FIGS. 2A and 2B are cross-sectional views of the SCR structure 100 along line AA' and line BB' in FIG. 1A, respectively. The SCR structure 100 includes an N-well 102 and a P-well 104 formed in a substrate 106. The N-well 102 and P-well 104 are arranged side by side and meet at an interface 110.

In some embodiments, the N-well 102 and the P-well 104 may be formed by doping N-type impurities and P-type impurities, respectively, into the substrate 106 via, for example, implantation or diffusion. In some embodiments, the substrate 106 may be an N-type substrate. The P-well 104 may be formed by doping P-type impurities into a portion of the N-type substrate 106, while another portion of the N-type substrate 106 that is not doped with the P-type impurities may be used as the N-well 102.

Alternatively, in some embodiments, the substrate 106 may be a P-type substrate. The N-well 102 may be formed by doping N-type impurities into the P-type substrate 106, and another portion of the P-type substrate 106 that is not doped with the N-type impurities may be used as the P-Well 104.

In some embodiments, the substrate 106, whether P-type or N-type, may be a silicon substrate or a silicon-on-insulator (SOI) substrate. The N-type impurities for forming N-well 102, and those in substrate 106 when substrate 106 is provided as N-type, include phosphorus, arsenic, or antimony. The P-type impurities for forming P-well 104, and those in substrate 106 when substrate 106 is provided as P-type, include boron or aluminum. The impurity concentrations in the N-well 102 and the P-well 104 may be about $1 \times 10^{15}$ cm$^{-3}$ to about $1 \times 10^{17}$ cm$^{-3}$ and about $1 \times 10^{16}$ cm$^{-3}$ to about $1 \times 10^{17}$ cm$^{-3}$, respectively.

As shown in FIG. 1A, a heavily-doped N-type region (N$^+$ region) 122 and a heavily-doped P-type region (P$^+$ region) 124 are formed in the N-well 102. Similarly, a heavily-doped P-type region (P$^{3+}$ region) 142 and a heavily-doped N-type region (N$^+$ region) 144 are formed in the P-well 104. The heavily-doped regions 122, 124, 142, and 144 have a doping level (impurity concentration) higher, for example, more than two orders of magnitude higher, than that of the N-well 102 and the P-well 104. The N$^+$ regions 122 and 144 are doped with N-type impurities, such as phosphorus, arsenic, or antimony. The P$^+$ regions 124 and 142 are doped with P-type impurities, such as boron or aluminum. In some embodiments, the impurity concentration in each of the region 122, P$^+$ region 124, P$^+$ region 142, and N$^+$ region 144 may be about $1 \times 10^{10}$ cm$^3$ to about $5 \times 10^{20}$ cm$^{-3}$. The concentrations in these heavily-doped regions may be the same as or different from each other.

As shown in FIG. 1A, the N$^+$ region 122 and the P$^+$ region 124 in the N-well 102 are staggered along a direction perpendicular to the interface 110, i.e., staggered along the x-direction depicted in FIG. 1A. That is, as shown in the enlarged view in FIG. 1B, a left edge 1222 of the N$^+$ region 122 does not align with a left edge 1242 of the P$^+$ region 124. Similarly, a right edge 1224 of the N$^+$ region 122 does not align with a right edge 1244 of the P$^+$ region 124. The N$^+$ region 122 and the P$^+$ region 124 are also staggered along a direction parallel to the interface 110, i.e., staggered along the y-direction depicted in FIG. 1A. That is, as shown in the enlarged view in FIG. 1B, an upper edge 1226 of the N$^+$ region 122 does not align with an upper edge 1246 of the P$^+$ region 124. Similarly, a lower edge 1228 of the N$^+$ region 122 does not align with a lower edge 1248 of the P$^+$ region 124. As also shown in FIG. 1A, the P$^+$ region 142 and the N$^+$ region 144 in the P-well 104 are also staggered along the x-direction and the y-direction.

In some embodiments, the N$^+$ region 122 and the P$^+$ region 124 do not overlap in either the x-direction or the y-direction. Similarly, the P region 142 and the N$^+$ region 144 do not overlap in either the x-direction or the y-direction. As used in the present disclosure, two regions "overlapping" does not mean that one region is physically formed over the other region. Instead, for example, two regions "overlapping in the x-direction" means that at least one of the left edge or the right edge of one region is positioned along the x-direction between the left edge and the right edge of the other region. Thus, two regions "not overlapping in the x-direction" means that neither the left edge nor the right edge of any of the two regions is positioned along the x-direction between the left edge and the right edge of the other region. As shown in FIG. 1B, for example, the right edge 1244 of the P$^+$ region 124 is positioned along the x-direction to the left of the left edge 1222 of the N$^+$ region 122. With regard to positioning along the y-direction, in the present embodiment, the upper edge 1246 of the P$^+$ region 124 is positioned along the y-direction to align with the lower edge 1228 of the N$^+$ region 122.

The relative arrangement of the N$^+$ region 122 and the P$^+$ region 124 does not need to be the same as shown in FIGS. 1A and 1B. For example, in some embodiments, the position of the right edge 1244 of the P$^+$ region 124 along the x-direction may align with the left edge 1222 of the N$^+$ region 122. As another example, in some embodiments, the position of the upper edge 1246 of the P$^+$ region 124 along the y-direction may be higher or lower than the lower edge 1228 of the N$^+$ region 122. As a further example, while holding L24 unchanged and all other dimensions the same, if the position of the upper edge 1246 of the P$^+$ region 124 along the y-direction is higher than the lower edge 1228 of the N$^+$ region 122 (and thus the lower edge 1248 of the P$^+$ region 124 is also positioned higher than that shown in FIGS. 1A and 1B), the SCR effect of the SCR structure is suppressed and the diode effect of the SCR structure is enhanced. That is, the ESD level of the SCR structure, i.e., the highest voltage at which the SCR structure can still safely discharge electrostatic, becomes lower than that in the situation shown in FIGS. 1A and 1B, and the holding voltage of the SCR structure becomes higher. On the other hand, while holding L24 unchanged and all other dimensions the same, if the position of the upper edge 1246 of the P$^+$ region 124 along the y-direction is lower than the lower edge 1228 of the N$^+$ region 122 (and thus the lower edge 1248 of the region 124 is also positioned lower than that shown in FIGS. 1A and 1B), the SCR effect of the SCR structure is enhanced, and both the trigger voltage and the holding voltage of the SCR structure become lower than those in the situation shown in FIGS. 1A and 1B.

Similar relative positioning also applies to the P+ region 142 and the N+ region 144 in the P-well 104. However, the positions of the heavily doped regions 142 and 144 in the P-well 104 do not need to he mirror reflections of the positions of the heavily doped regions 122 and 124 in the N-well 102. That is, D22 and D42 may be different from each other, and D24 and D44 may be different from each other.

As shown in FIG IA, the N+ region 122, the P+ region 124, the P+ region 142, and the N+ region 144 have an elongated shape extending in the y-direction. However, in accordance with other embodiments of the present disclosure, the heavily-doped regions 122, 124, 142, and 144 may have other shapes, such as a square shape, or an elongated shape extending in the x-direction.

In the present disclosure, the dimension of a region in the x-direction is referred to as the width of that region, and the dimension of a region in the y-direction is referred to as the length of that region. In some embodiments, each of the width W22 of the N+ region 122, the width W24 of the P+ region 124, the width W42 of the P+ region 142, and the width W44 of the N+ region 144 may be about 0.1 µm to about 10 µm. These widths may be the same as or different from each other. Each of the length L22 of the N+ region 122, the length L24 of the P+ region 124, the length L42 of the P+ region 142, and the length L44 of the N+ region 144 may be about 10 µm to about 100 µm. These lengths may be the same as or different from each other.

As shown in FIG. 1A, the N+ region 122 is positioned at a distance D22 from the interface 110, the P+ region 124 is positioned at a distance D24 from the interface 110, the P+ region 142 is positioned at a distance D42 from the interface 110, and the N+ region 144 is positioned at a distance D44 from the interface 110. In some embodiments, distances D22, D24, D42, and D44 may be about 4 µm to about 10 µm, about 4 µm to about 80 µm, about 4 µm to about 10 µm, and about 4 µm to about 80 µm, respectively.

Figure 3:
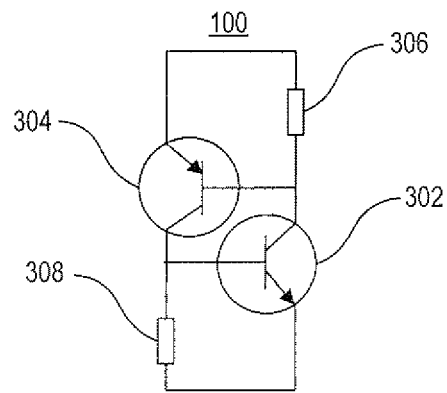
FIG. 3 shows an equivalent circuit of the SCR structure of FIG. 1A.

FIG. 3 shows an equivalent circuit of the SCR structure 100 consistent with embodiments of the present disclosure. As shown in FIG. 3, the equivalent circuit of the SCR structure 100 includes an NPN transistor 302, a PNP transistor 304, an N-well resistor 306, and a P-well resistor 308. The base of the NPN transistor 302 is connected with the collector of the PNP transistor 304. The base of the PNP transistor 304 is connected with the collector of the NPN transistor 302.

Referring also to FIG. 1A, the N-well 102 functions as the collector of the NPN transistor 302, the P-well 104 functions as the base of the NPN transistor 302, and the N+ region 144 in the P-well 104 functions as the emitter of the NPN transistor 302. The N+ region 122 in the N-well 102 functions as an ohmic contact layer for the collector of the NPN transistor 302. Similarly, the P-well 104, N-well 102, and P+ region 124 in the N-well 102 function as the collector, base, and emitter of the PNP transistor 304, respectively. In addition, the P+ region 124 in the P-well 104 functions as an ohmic contact layer for the collector of the PNP transistor 304.

The characteristics of the SCR structure 100 mainly depend on the characteristics of the NPN transistor 302 and the PNP transistor 304. Consistent with embodiments of the present disclosure, adjusting the length L44 and the distance D44 may affect the characteristics of the NPN transistor 302, and adjusting the length L24 and the distance D24 may affect the characteristics of the PNP transistor 304. By varying the characteristics of the NPN transistor 302 and the PNP transistor 304, the characteristics of the SCR structure 100 can be varied. For example, increasing the distance D44 may increase the holding voltage of the SCR structure 100. Changing the length L44 may affect the turn-on voltage of the NPN transistor 302, so as to affect the trigger voltage of the SCR structure 100. The whole length of the SCR structure 100 in the y-direction, i.e., the distance in the y-direction from the upper edge 1226 of the N+ region 122 to the lower edge 1248 of the P+ region 124, may also affect the characteristics of the SCR structure 100. As the whole length of the SCR structure 100 increases, the total current conducting area of the SCR structure 100 increases. Therefore, the ESD current can spread in a larger area. Accordingly, the SCR structure 100 can sustain higher current and higher voltage. As a result, the ESD level of the SCR structure 100 increases.

By adopting a layout consistent with embodiments of the present disclosure, the characteristics of the NPN transistor 302 and the PNP transistor 304 can be adjusted individually, and appropriate trigger voltage and holding voltage of the SCR structure 100 can be set at the same time. Therefore, the ESD performance of the SCR structure 100 can be set without increasing the footprint.

FIG. 1A shows an exemplary layout consistent with embodiments of the present disclosure. Other layouts may also provide similar benefits as the layout in FIG. 1A does. In some embodiments, any one or more of the heavily-doped regions 122, 124, 142, and 144 may be provided as two or more separate segments. For example, in an SCR structure 400 shown in FIG. 4, the N+ region in the N-well 102 has two segments 122-1 and 122-2, and the P+ region in the P-well 104 has two segments 142-1 and 142-2. The total length of the two segments 122-1 and 122-2 may be larger than the length L22 in FIG. 1. Similarly, the total length of the two segments 142-1 and 142-2 may be larger than the length L42 in FIG. 1.

Figure 4:
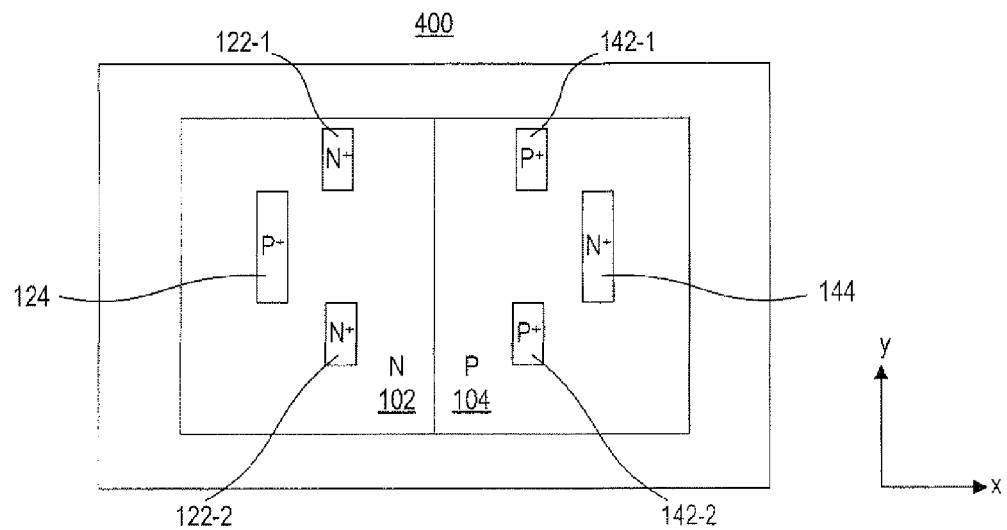
FIG. 4 is a plan view schematically showing a layout of an SCR structure according to an exemplary embodiment.

As shown in FIG. 4, each of the two segments 122-1 and 122-2 in the N-well 102 is staggered along both the x-direction and the y-direction with respect to the P+ region 124. In some embodiments, each of the two segments 122-1 and 122-2 in the N-well 102 does not overlap with the P+ region 124 in either the x-direction or the y-direction. In some embodiments, the lower edge of segment 122-1 may be positioned along the y-direction to align with the upper edge of the P+ region 124; and the upper edge of segment 122-2 may be positioned along the y-direction to align with the lower edge of the P+ region 124. The relative arrangement of the N+ region segments 122-1 and 122-2, and the P+ region 124 does not need to be exactly the same as shown in FIG. 4. For example, in some embodiments, the position of the right edge of the P+ region 124 along the x-direction may align with the left edges of the N+ region segments 122-1 and 122-2. As another example, in some embodiments, the position of the upper edge of the P+ region 124 along the y-direction may be higher or lower than the lower edge of the N+ region segment 122-1, and the position of the lower edge of the P+ region 124 along the y-direction may be higher or lower than the upper edge of the N+ region segment 122-2. Similar relative positioning also applies to the N+ region 144 and the two segments 142-1 and 142-2 in the P-well 104. However, similar to the situation with respect to FIG. 1A, the positions of the P+ region segments 142-1. and 142-2 and the N+ region 144 in the P-well 104 do not need to be mirror reflections of the positions of the N+ region segments 122-1 and 122-2 and the P+ region 124 in the N-well 102.

Figure 5:
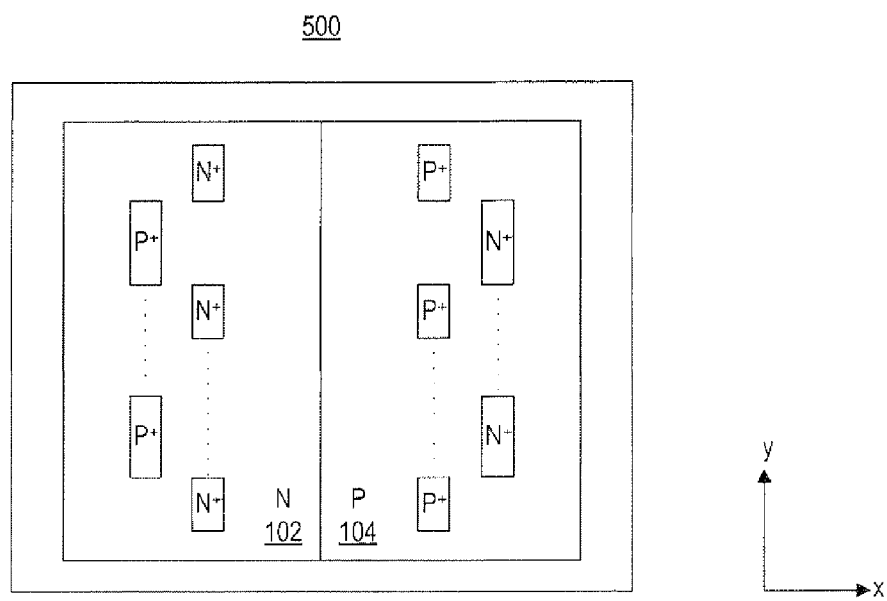
FIG. 5 is a plan view schematically showing a layout of an SCR structure according to an exemplary embodiment.

As another example, in an SCR structure 500 shown in FIG. 5, all of the heavily-doped regions in both the N-well 102 and the P-well 104 have multiple segments. The total length of the segments of one heavily-doped region in the SCR structure 500 may be larger than the length of the corresponding heavily-doped region in the SCR structure 100. Therefore, the SCR structure 500 may be considered as an integration of multiple SCR structures 100, and thus may have an even higher ESD level.

Figure 6:
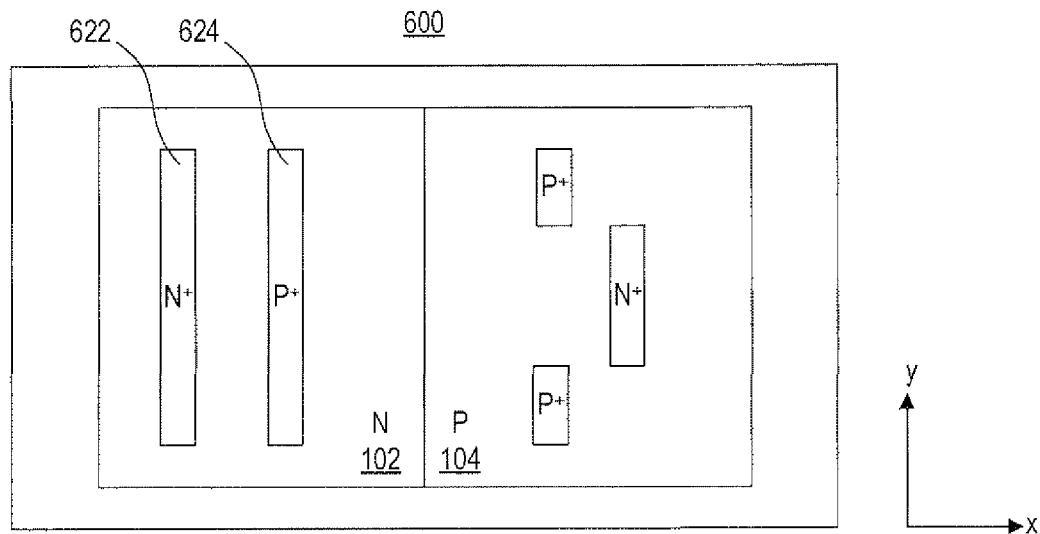
FIG. 6 is a plan view schematically showing a layout of an SCR structure according to an exemplary embodiment.

Consistent with embodiments of the present disclosure, a conventional layout may be adopted for the heavily-doped regions in one of the two wells, so as to simplify the entire layout design, while at the same time achieving the benefits taught in the present disclosure. For example, in an SCR structure 600 shown in FIG. 6, a conventional layout is adopted for the heavily-doped regions in the N-well 102, i.e., an N$^+$ region 622 and a P$^+$ region 624 in the N-well 102 are formed parallel to each other and completely overlap along the y-direction (that is, the upper and lower edges of the N$^+$ region 622 align with the upper and lower edges of the P$^+$ region 624, respectively). However, the P$^+$ and N$^+$ regions in the P-well 104 are arranged consistent with embodiments of the present disclosure.

Figure 7:
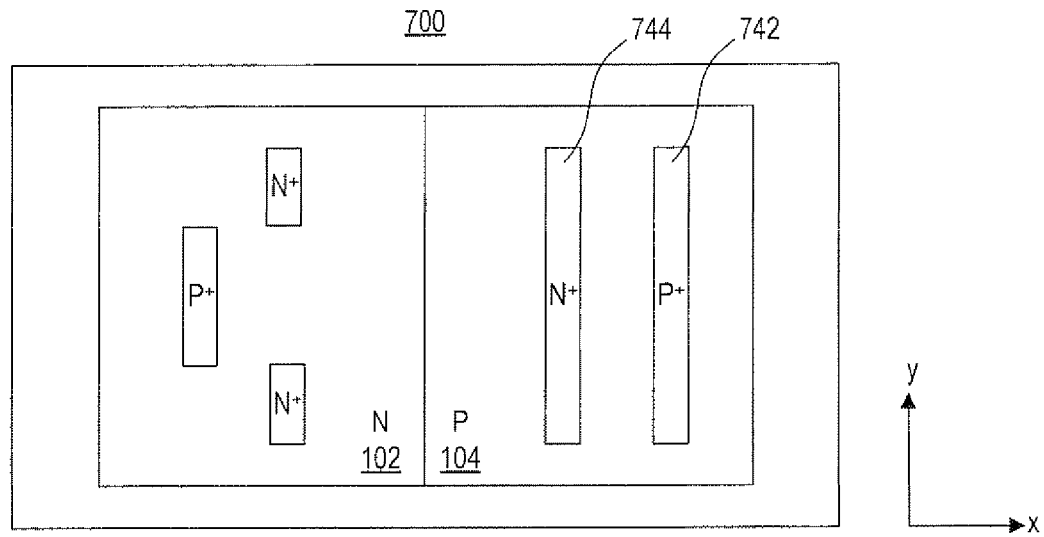
FIG. 7 is a plan view schematically showing a layout of an SCR structure according to an exemplary embodiment.

Similarly, in an SCR structure 700 shown in FIG. 7, a traditional layout is adopted for the heavily-doped regions in the P-well 104, i.e., a P$^+$ region 742 and an N$^+$ region 744 are formed parallel to each other and completely overlap in the y-direction. However, the P$^+$ and N$^+$ regions in the N-well 102 are arranged consistent with embodiments of the present disclosure.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device for electrostatic discharge protection, comprising:
   a substrate;
   a first well formed in the substrate, the first well having a first conductivity type;
   a second well formed in the substrate, the second well having a second conductivity type different than the first conductivity type, the first and second wells being formed side by side and meeting at an interface;
   a first heavily-doped region having the first conductivity type and formed in the first well, the first heavily-doped region being positioned at a first distance from the interface;
   a second heavily-doped region having the second conductivity type and formed in the first well, the second heavily-doped region being positioned at a second distance from the interface;
   a third heavily-doped region having the second conductivity and formed in the second well, the third heavily-doped region being positioned at a third distance from the interface; and
   a fourth heavily-doped region having the first conductivity type and formed in the second well, the fourth heavily-doped region being positioned at a fourth distance from the interface, and the fourth distance being different from the third distance,
   wherein positions of the first and second heavily-doped regions are staggered along a direction parallel to the interface.

2. The semiconductor device according to claim 1, wherein the first distance is smaller than the second distance.

3. The semiconductor device according to claim 1, wherein the first distance is in a range of about 4 μm to about 10 μm, and the second distance is in a range of 4 μm to about 80 μm.

4. The semiconductor device according to claim 1, wherein the third distance is in a range of 4 μm to about 10 μm, and the fourth distance is in a range of 4 μm to about 80 μm.

5. The semiconductor device according to claim 1, wherein at least one of the first and third heavily-doped regions includes two separated segments.

6. The semiconductor device according to claim 1, wherein at least one of the second and fourth heavily-doped regions includes two separated segments.

7. The semiconductor device according to claim 1, wherein the first, second, third, and fourth heavily-doped regions have an elongated shape extending along the direction parallel to the interface.

8. The semiconductor device according to claim 1, wherein the direction parallel to the interface is a first direction, and wherein the first and second heavily-doped regions do not overlap either in the first direction or in a second direction perpendicular to the first direction.

9. The semiconductor device according to claim 8, wherein the third and fourth heavily-doped regions do not overlap in either the first direction or the second direction.

10. The semiconductor device according to claim 1, wherein the substrate includes a semiconductor substrate.

11. The semiconductor device according to claim 10, wherein the semiconductor substrate includes a silicon substrate.

12. The semiconductor device according to claim 11, wherein the first conductivity type is N-type, and the second conductivity type is P type.

13. The semiconductor device according to claim 12, wherein the first well is doped with at least one of phosphorus, arsenic, or antimony, and the second well is doped with at least one of boron or aluminum.

14. The semiconductor device according to claim 12, wherein the first well is doped at a level of about $1\times10^{15}$ cm$^{-3}$ to about $1\times10^{17}$ cm$^{-3}$, and the second well is doped at a level of about $1\times10^{16}$ cm$^{-3}$ to about $1\times10^{17}$ cm$^{-3}$.

15. The semiconductor device according to claim 12, wherein the first heavily doped region is doped at a level of about $1\times10^{19}$ cm$^{-3}$ to about $5\times10^{20}$ cm$^{-3}$, the second heavily-doped region is doped at a level of about $1\times10^{19}$ cm$^{-3}$ to about $5\times10^{20}$ cm$^{-3}$, the third heavily-doped region is doped at a level of about $1\times10^{19}$ cm$^{-3}$ to about $5\times10^{20}$ cm$^{-3}$, and the fourth heavily-doped region is doped at a level of about $1\times10^{19}$ cm$^{-3}$ to about $5\times10^{20}$ cm$^{-3}$.

* * * * *